United States Patent [19]
Ngo et al.

[11] Patent Number: 5,532,631
[45] Date of Patent: Jul. 2, 1996

[54] ACTIVE PULL-DOWN WRITE DRIVER FOR THREE-TERMINAL INDUCTIVE LOAD

[75] Inventors: Tuan V. Ngo, Eden Prairie; Raymond E. Barnett, Burnsville, both of Minn.

[73] Assignee: VTC Inc., Bloomington, Minn.

[21] Appl. No.: 341,495

[22] Filed: Nov. 17, 1994

[51] Int. Cl.⁶ ............................... H03K 3/00; H03K 1/04
[52] U.S. Cl. .................... 327/110; 327/304; 327/423
[58] Field of Search ............................... 327/423, 304, 327/372, 110

[56] References Cited

U.S. PATENT DOCUMENTS

| | | | |
|---|---|---|---|
| 4,050,086 | 9/1977 | Harr | 360/66 |
| 4,523,238 | 6/1985 | Keel et al. | 360/46 |
| 4,816,934 | 3/1989 | Tsuyuguchi | 360/62 |
| 5,282,094 | 1/1994 | Ngo | 360/46 |
| 5,287,231 | 2/1994 | Shier et al. | 360/68 |
| 5,291,347 | 3/1994 | Ngo et al. | 360/68 |
| 5,296,975 | 3/1994 | Contreras et al. | 360/46 |
| 5,397,878 | 3/1995 | Chen | 327/110 |

OTHER PUBLICATIONS

Pshaenich. Electronic Design 4, Feb. 15, 1977 pp. 86–91.
IBM Tech Disc. Bul. vol. 20, No. 5, Oct. 1977 Grimmes "Data Bus Driver".

Primary Examiner—Magraret Rose Wambach
Attorney, Agent, or Firm—Kinney & Lange

[57] ABSTRACT

A write driver for a magnetic transducer having a three-terminal inductive coil includes first and second voltage sources, a write current source, and a switching network having first and second switching transistors connected between the second voltage source and the respective first and second taps. The switching network responds to respective first and second inputs to switch the write current between respective first and second taps. Active pull-down subcircuits operate to alternately supply base current to the respective first and second switching transistors to charge parasitic capacitances of the respective switching transistors and to alternately sink base current from the respective switching transistors to discharge parasitic capacitances.

15 Claims, 2 Drawing Sheets

ACTIVE PULL-DOWN WRITE DRIVER FOR THREE-TERMINAL INDUCTIVE LOAD

BACKGROUND OF THE INVENTION

The present invention relates generally to write driver technology for inductive-type magnetic transducers. More particularly, it pertains to a write driver circuit for a three-terminal inductive transducer having improved switching performance.

Inductive-type magnetic transducers are widely used for writing to and/or reading from magnetic data-storage media. Conventionally, transducers write binary-formatted data to a moving magnetic storage medium, such as a rotating magnetic disc, by imparting a bipolar magnetic pattern representing the binary data to the medium. Producing the bipolar magnetic pattern entails alternately forcing electric current through the inductive coil in forward and reverse directions to correspond to the binary data. Current flowing through a conductor generates a magnetic field according to the direction of flow through the coil; thus, reversing the direction of current reverses the magnetic field. Applying the field generated by the coil to the medium coerces a series of adjacent magnetic dipoles of the medium into alignment with the field to form a readable magnetic pattern.

A write driver controls the flow of current through the inductive coil by directing current flow in forward and reverse directions according to an applied input. There are two types of write drivers: one for two-terminal inductive coils and the other for three-terminal inductive coils. Two-terminal coils are formed from a two-ended wound conductor. Write drivers for two-terminal coils are configured by four switches arranged as diagonal pairs, one pair directing current flow in one direction through the coil and the other pair directing current flow in the opposite direction. This arrangement is commonly called an H-bridge or H-switch.

Three-terminal inductive write drivers, on the other hand, require only two switches. A three-terminal inductive coil comprises two oppositely-wound coils connected together at one end to form a center tap. The remaining two free ends are referred to as first and second end taps. The center tap is usually connected to a voltage source and the end taps are connected via first and second switches to a current source. Thus, the first switch controls current flow in the coil section terminated by the center tap and the first end tap, and the second switch controls current flow in the section between the center tap and the second end tap. The oppositely-wound coils generate magnetic fields having opposite polarities. Accordingly, the switches are toggled to produce a bipolar magnetic pattern on a medium adjacent the transducer.

Typically, the switches in write drivers for inductive transducers are built from transistors, such as a bipolar junction transistor. Unlike ideal switches, the bipolar junction transistor switch includes a parasitic base-to-collector (BTC) capacitance that prevents instantaneous changes between conductive (active) and non-conductive states of the transistor. In fact, the BTC capacitance introduces an appreciable delay in the transition between the two states of the transistor switch. The effect of this delay is best explained by reference to the write driver circuit shown in FIG. 1.

FIG. 1 is a circuit diagram of a prior art three-terminal inductive write driver. A resistor R3 and a current source I1 operate a transistor Q4 to enable the write driver. Transistor Q4 is connected between a voltage source Vcc (usually 5 or 12 VDC) and a center tap 12 of inductive coil L via a terminal 10. First and second end taps 14 and 16 of coil L are connected to the respective collectors of NPN switching transistors Q3 and Q5. The emitters of transistors Q3 and Q5 are connected together and to the positive terminal of a current source Iw. The negative terminal of source Iw is connected to voltage source $V_{EE}$ via a terminal 22. The bases of transistors Q3 and Q5 are connected to the respective emitters of NPN drive transistors Q2 and Q6. The collectors of transistors Q2 and Q6 are connected to source $V_{cc}$ via terminal 10, and their emitters are connected through respective resistors R2 and R4 to source $V_{EE}$. The emitters of PNP input transistors Q1 and Q7 are connected together and through a current source I2 to source $V_{cc}$. The collectors of transistors Q1 and Q7 are connected to respective bases of transistors Q2 and Q6 and to source $V_{EE}$ via respective resistors R1 and R5.

Functionally, switching transistors Q3 and Q5 form a differential switching pair that applies write current Iw to the end taps 14 or 16 of coil L, according to the higher of the respective transistor base potentials $V_{BE3}$ and $V_{BE5}$. Transistors Q2 and Q6 are configured as emitter-followers, tracking respective base voltages $V_{BE2}$ and $V_{BE6}$ and isolating input transistors Q1 and Q7 from switching transistors Q3 and Q5. Like transistors Q3 and Q5, transistors Q1 and Q7 also form a differential pair. However, because transistors Q1 and Q7 are PNP types, they steer current I2 to the transistor Q1 or Q7 that has the lower base potential. In other words, the lower of the two inputs $I_N$ and $I_{NN}$ controls through which transistor current I2 passes.

Ordinarily, inputs $I_N$ and $I_{NN}$ are not low at the same time. When input $I_N$ is low, as compared to input $I_{NN}$, input transistor Q1 directs substantially all current from source I2 through transistor Q1 and resistor R1 to source $V_{EE}$ via terminal 22. Thus, the collector voltage $V_{c1}$ of transistor Q1 and base voltage $V_{B2}$ of transistor Q2 rise from $V_{EE}$ by an amount equal to $(I_{C1}-I_{B2})R1$ to activate transistor Q2. When transistor Q2 is active, i.e. operating in a conductive state, the emitter voltage $V_{E2}$ of transistor Q2 and base voltage $V_{B3}$ of transistor Q3 are approximately 0.7 volts (one emitter-base junction drop) less than the base voltage $V_{B2}$ of transistor Q2. The emitter voltage $V_{E2}$ is also appreciably greater than the base voltage $V_{B5}$ of transistor Q5, which, because input $I_{NN}$ is high, is at or near ground potential ($V_{EE}$). Thus, write current Iw flows through the Q3 side of inductive coil L, generating a magnetic field having a first polarity. Reversing polarity of the field requires activating transistor Q5 and deactivating transistor Q3 by switching inputs $I_{NN}$ and $I_N$ low and high, respectively. Operating input $I_{NN}$ low activates transistors Q7, Q6, and Q5 to switch write current Iw to the Q5 side of inductive coil L, thereby generating a field having a second polarity, opposite the first. Simultaneously, operating input $I_N$ high deactivates transistors Q1, Q2, and Q3 to terminate current flow to the Q3 side of coil L. Hence, by selectively varying inputs $I_N$ and $I_{NN}$, write current Iw may be applied to one or the other side of the coil to write a specific bipolar magnetic pattern on a magnetic medium.

In practice, the prior art driver of FIG. 1 suffers from switching limitations. More particularly, large parasitic base-to-collector (BTC) capacitances exist in switching transistors Q3 and Q5. These BTC capacitances are slow to charge and discharge; hence, they delay the transitions between the conductive and non-conductive operating states of the switching transistors. The parasitic capacitances are a performance liability because the time they require for charging and discharging limits the write frequency of the transducer and the storage density of the medium. The adverse effect on performance is especially acute during a magnetic field reversal.

To reverse the magnetic field, both of the switching transistors are switched, i.e., one is switched from non-conducting to conducting and the other from conducting to non-conducting. In FIG. 1, the BTC capacitances of transistors Q3 and Q5 are charged and discharged by the respective base currents $I_{B3}$ and $I_{B5}$. The charging base currents are supplied by the emitters of transistors Q2 and Q6. Although transistors Q2 and Q6 are good sources of current, they do not charge the BTC capacitances quickly enough to avoid slewing the output of the transducer.

Discharging the BTC capacitances occurs passively by sinking base currents through respective resistors R2 and R4 to source $V_{EE}$. Currents sinking through resistors R2 and R4 produce voltages that support the base potentials of respective transistors Q3 and Q5. Supporting these base potentials keeps the respective transistors activated during discharge, thereby preventing Iw from switching as desired. Moreover, a portion of the discharge flows into the bases of the switching transistors, causing momentary conductive surges in the switching transistors. These momentary surges cause glitching in the output of the transducer. Thus, passive current sinking introduces further slewing and causes glitching in the output of the transducer. Although the size of resistors R2 and R4 could be reduced to speed the rate of discharge, to do so would unacceptably increase the steady-state power needs of the driver without solving the glitching problem. In sum, limitations in sourcing and sinking the base currents of transistors Q3 and Q5 cause appreciable slewing and glitching, generally degrading the quality of data written to a medium, increasing the time required to write data, and restricting the storage density of the medium.

SUMMARY OF THE INVENTION

The present invention pertains to a write driver for a magnetic transducer having an inductive winding with first and center taps. The write driver includes first and second voltage sources, a source of write current, and a switching network having a first switching transistor. The first voltage source is connected to the center tap, and the source of write current is connected between the second voltage source and the first switching transistor. The first switching transistor is connected between the first tap and the source of write current. The switching network responds to a first input to switch the write current to the first tap. An active pull-down subcircuit responds to a first mode of the first input to supply base current to the first switching transistor and responds to a second mode of the first input to sink base current from the first switching transistor.

In a preferred embodiment, the inductive winding has a second tap, and the driver has a second switching transistor. The second switching transistor responds to a second input to switch write current between the first and second taps. First and second active pull-down subcircuits comprise first and second PNP-type drive transistors and first and second current sources. The first drive transistor responds to a first mode of the first input to apply the first current source to the base of the first switching transistor and responds to a second mode of the first input to sink base current from the first switching transistor. The second drive transistor responds to a first mode of the second input to apply the second current source to the base of the second switching transistor and responds to a second mode of the second input to sink base current from the second switching transistor.

One aspect of the invention relates a method of switching write current between first and second taps of an inductive load of a transducer. The method comprises providing a write drive circuit having a write current source and a switching network. First and second switching transistors of the switching network respond to respective first and second inputs to switch the write current between the first and second taps. The first and second inputs are operated to apply a current source to the base of the first switching transistor while applying an active current sink to the base of the second switching transistor.

Another aspect of the invention concerns a method of charging and discharging the parasitic capacitance of a switching transistor operating between conductive and non-conductive states to supply write current to an inductive load. The method comprises applying a current source to the base of the switching transistor to operate the transistor to a conductive state and applying an active current sink to the base of the switching transistor to operate the transistor to a non-conductive state.

DETAILED DESCRIPTION OF THE PREFERRED EMBODIMENTS

Figure 1:
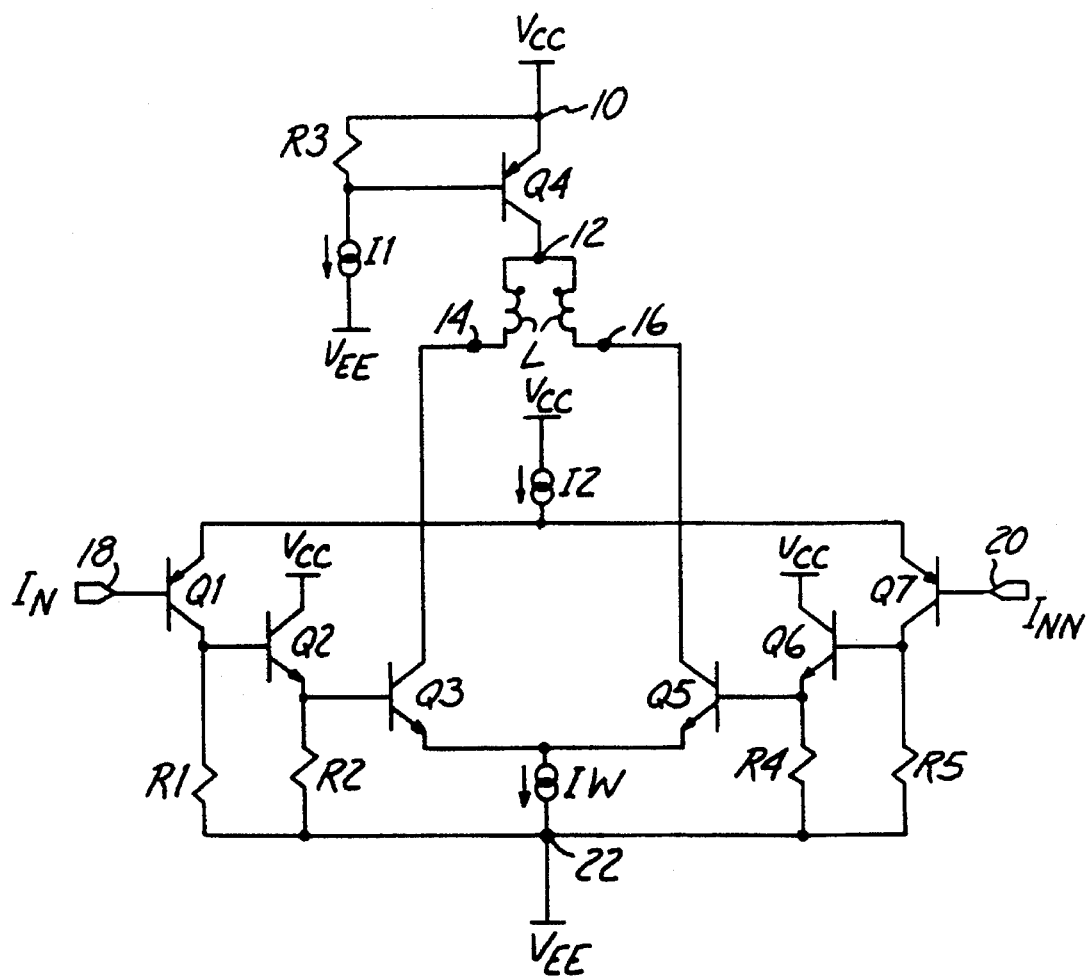
FIG. 1 is a diagram of a prior art write driver circuit.
Figure 2:
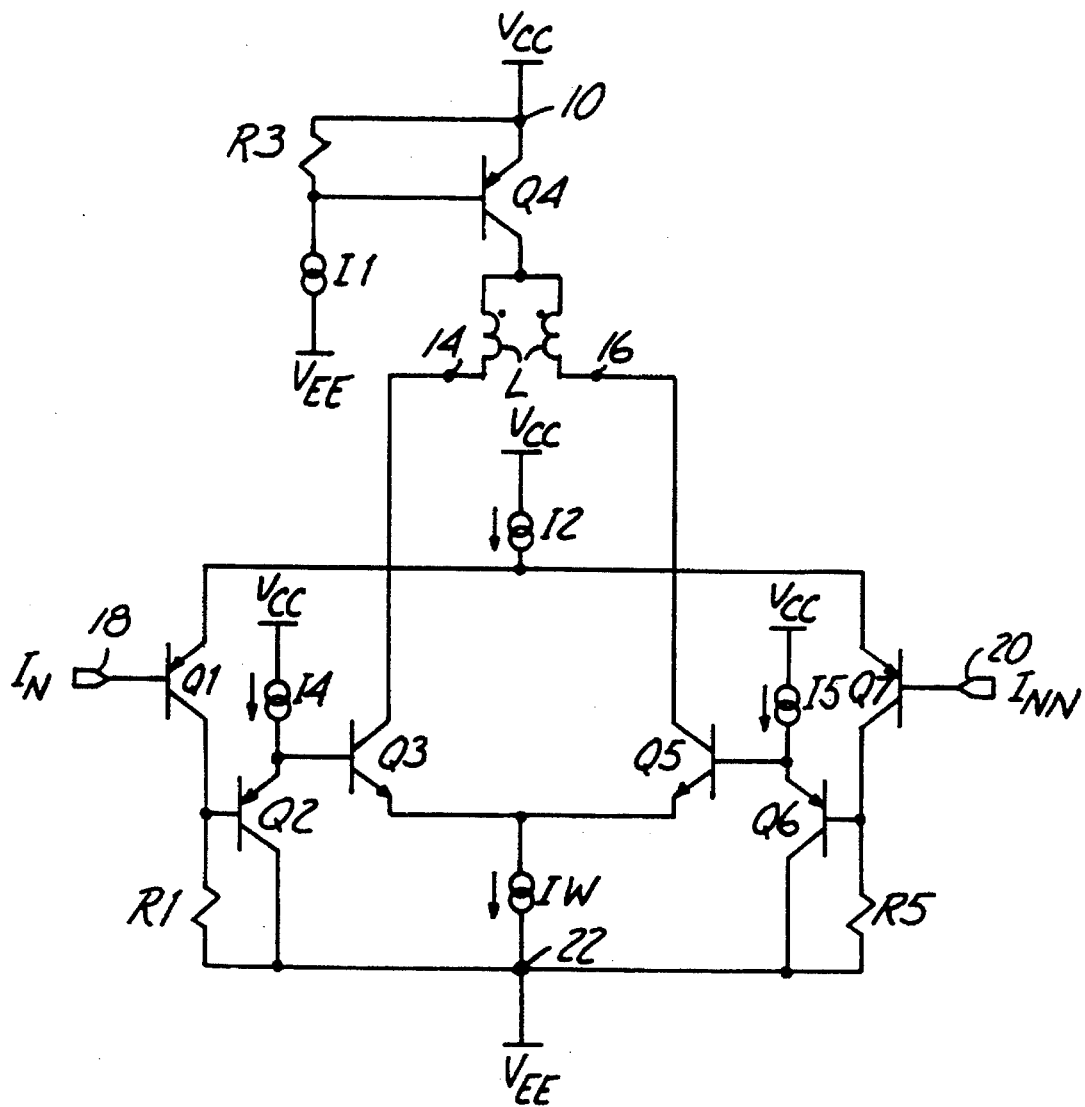
FIG. 2 is a diagram of a write driver circuit according to the present invention.

FIG. 2, with like parts numbered as in FIG. 1, shows a three-terminal inductive write driver encompassing the improvement of the present invention. A center tap 12 of inductive coil L is connected through a transistor Q4 to a voltage source $V_{cc}$ via a terminal 10. A resistor R3 is connected between the emitter and base of transistor Q4 and a current source I1 is connected between resistor R3 and a voltage source $V_{EE}$. End taps 14 and 16 are connected respectively to the collectors of NPN switching transistors Q3 and Q5. The emitters of transistors Q3 and Q5 are connected together and to the positive terminal of current source Iw. The negative terminal of source Iw is connected to voltage source $V_{EE}$ via terminal 22. The bases of transistors Q3 and Q5 are connected to the respective emitters of PNP drive transistors Q2 and Q6. The collectors of transistors Q2 and Q6 are connected to source $V_{EE}$ via terminal 22, and their emitters are connected to the respective bases of transistors Q3 and Q5 and to voltage source $V_{cc}$ through current sources I4 and I5, respectively. The emitters of PNP input transistors Q1 and Q7 are connected via current source I2 to terminal 10. The collectors of transistors Q1 and Q7 are connected to the respective bases of transistors Q2 and Q6 and to terminal 20 via resistors R1 and R5, respectively. Inputs $I_N$ and $I_{NN}$ at respective terminals 18 and 20 are connected to the respective bases of transistors Q1 and Q7.

Switching transistors Q3 and Q5 form a differential pair that switches write current Iw to one or the other side of inductive coil L, according to the higher of respective base potentials $V_{BE3}$ or $V_{BE5}$. PNP transistors Q1 and Q7 are configured differentially to provide a path for current I2 according to the lower of the inputs $I_N$ and $I_{NN}$. PNP drive transistors Q2 and Q6 and current sources I4 and I5 operate conjunctively to discharge and charge the BTC capacitances of transistors Q3 and Q5.

When input $I_N$ is low, as compared to $I_{NN}$, input transistor Q1 conducts current from source I2 through transistor Q1 and resistor R1 to source $V_{EE}$ via terminal 22. Thus, the collector voltage $V_{C1}$ of transistor Q1 and the base voltage $V_{B2}$ of transistor Q2 rise from $V_{EE}$ by an amount equal to $(I_{C1}+I_{B2})R1$ to partially deactivate PNP transistor Q2. The emitter voltage $V_{E2}$ of transistor Q2 and the base voltage $V_{B3}$ of transistor Q3 are one junction drop (approximately 0.7 volts) greater than the emitter voltage $V_{E3}$ of transistor Q3, which is near $V_{EE}$, causing transistor Q3 to conduct. Because transistor Q2 is partially deactivated, current source I4 supplies current to the base of transistor Q3 to quickly charge the BTC capacitance of transistor Q3, thereby rapidly driving transistor Q3 to a conductive state. Accordingly, write current Iw switches to the Q3 side of inductive coil L.

Likewise, when inputs $I_N$ and $I_{NN}$ are reversed, $I_N$ is high and $I_{NN}$ is low. Transistor Q1 becomes non-conductive, lowering base potential $V_{B2}$ to $V_{EE}$ and operating transistor Q2 to a full conductive state. Consequently, transistor Q2 actively discharges the BTC capacitance of transistor Q3 to ground ($V_{EE}$). With input $I_{NN}$ low, transistor Q7 conducts and shifts transistor Q6 to a partially deactivated state. With transistor Q6 partially deactivated, current from source I5 quickly charges the BTC capacitance of transistor QS, thereby enabling a rapid operation of transistor Q5 and consequent switching of write current Iw to the Q5 side of inductive coil L.

Although similar in basic operation and topology, the present invention as shown in FIG. 2 distinguishes markedly from the prior art circuit of FIG. 1. The present invention includes transistors Q2 and Q6 that are PNP transistors, rather than the NPN transistors used in the prior art. Hence, instead of transistors Q2 and Q6 tracking the states of the respective input transistors Q1 and Q7 as they do in the prior art, transistors Q2 and Q4 operate oppositely to provide an active load for quickly discharging the BTC capacitances of transistors Q3 and Q5. Moreover, the present invention promotes discharging the BTC capacitances by minimizing or even eliminating resistors R2 and R4 of the prior art circuit without adversely affecting the steady-state power demands of the driver. Removing resistors R2 and R4 yields the further advantage of precluding the discharging BTC capacitances from supporting the base potentials of the switching transistors during deactivation. Furthermore, the present invention includes current sources I4 and I5. Current sources I4 and I5 cooperate with the PNP transistors Q2 and Q6 such that when transistors Q2 and Q6 are partially deactivated they enable the current sources to actively charge the BTC capacitances of respective switching transistors Q3 and Q5. In sum, sources I4 and I5 and transistors Q2 and Q6 cooperate to yield a faster switching time by charging and discharging the respective BTC capacitances of switching transistors Q3 and Q5. Hence, the two source-transistor pairs are subcircuits that actively pull-up and pull-down the base voltages of switching transistors Q3 and Q5.

Although the present invention has been described with reference to preferred embodiments, workers skilled in the art will recognize that changes may be made in form and detail without departing from the spirit and scope of the invention.

What is claimed is:

1. In a write driver circuit for driving a magnetic transducer having an inductive winding having a tap, the driver circuit having a load terminal for coupling to the tap, a supply terminal for coupling to a voltage source, and a switching transistor connected between the load terminal and the supply terminal, the switching transistor having a control region responsive to a write signal for coupling the load terminal to the supply terminal, the improvement comprising:

an active subcircuit coupled between the control region and the supply terminal and responsive to the write signal for selectively varying conduction between the control region and the supply terminal; and a bias subcircuit coupled to the active subcircuit for maintaining conduction of the active subcircuit.

2. The apparatus of claim 1 wherein the active subcircuit comprises a drive transistor having a control region for controlling conduction between a pair of terminating regions, the pair of terminating regions coupled between the control region of the switching transistor and the supply terminal, the control region of the drive transistor responsive to the write signal for varying conduction between the pair of terminating regions.

3. The apparatus of claim 2 wherein the bias subcircuit includes a resistor coupled between the control region of the drive transistor and one of the pair of terminating regions.

4. The apparatus of claim 2 wherein the drive transistor is a PNP-type transistor having emitter and collector regions respectively coupled between the control region of the switching transistor and the supply terminal.

5. The apparatus of claim 2 wherein the write driver circuit includes a second supply terminal for coupling to a second voltage source and the active subcircuit further comprises a current source coupled between the control region of the drive transistor and the second supply terminal for supplying current to the control region of the switching transistor.

6. The apparatus of claim 5 wherein the active subcircuit further includes:

input means, coupled to the control region of the drive transistor, for increasing conduction between the pair of terminating regions to operate the switching transistor to a nonconductive state.

7. The apparatus of claim 1 wherein the inductive winding further includes a second tap and the driver circuit includes a second load terminal for coupling to the second tap and a second switching transistor connected between the second load terminal and the supply terminal, the second switching transistor having a second control region responsive to the write signal for coupling the second load terminal to the supply terminal, the improvement further comprising:

a second active subcircuit coupled between the second control region and the supply terminal and responsive to the write signal for varying conduction between the second control region and the supply terminal; and a second bias subcircuit coupled to the second active subcircuit for maintaining conduction of the second active subcircuit.

8. The apparatus of claim 7 wherein the second bias subcircuit maintains a first level of conduction of the second active subcircuit and the second active subcircuit further includes second input means responsive to the write signal for varying conduction of the second active subcircuit from the first level of conduction to a second level of conduction, the second level of conduction for rapidly discharging a parasitic capacitance of the second switching transistor to operate the second switching transistor to a nonconductive state.

9. The apparatus of claim 1 wherein the bias subcircuit maintains a first level of conduction of the active subcircuit and the active subcircuit further includes input means responsive to the write signal for varying conduction of the active subcircuit from the first level of conduction to a second level of conduction, the second level of conduction for discharging a parasitic capacitance of the first switching transistor to operate the first switching transistor to a nonconductive state.

10. A method of charging and discharging a parasitic capacitance of a switching transistor operating between conductive and non-conductive states to switch a write current to an inductive load, comprising:

supplying current to a base of the switching transistor to charge the parasitic capacitance and operate the transistor to a conductive state;

sinking a first current having a first magnitude from the base of the switching transistor, while supplying current to the base; and selectively sinking a second current having a greater magnitude than the first magnitude from the base to discharge the parasitic capacitance and operate the transistor to a nonconductive state.

11. The method of claim 10 wherein supplying current to the base includes operating a current source to supply current to the base, sinking the first current includes diverting a portion of the current supplied by the current source from the base of the switching transistor and selectively sinking the second current includes selectively diverting all current supplied by the current source from the base and sinking a discharge current from the base of the switching transistor.

12. A method of switching write current between first and second taps of an inductive coil of a transducer, the first and second taps coupled to respective first and second load terminals of a write driver circuit having a write current source and first and second switching transistors coupled between the write current source and the respective first and second load terminals, the method comprising:

supplying first and second currents having respective first and second magnitudes to respective bases of the first and second switching transistors;

operating a first drive transistor to sink current having a magnitude less than the first magnitude from the base of the first switching transistor while supplying the first current to the base of the first switching transistor, thereby operating the first switching transistor to a conductive state to conduct write current to the first tap; and operating a second drive transistor to sink current having a magnitude at least as great as the second magnitude from the base of the second switching transistor while supplying the second current to the base of the second switching transistor, thereby operating the second switching transistor to a nonconductive state to impede write current from the second tap.

13. The method of claim 12 further including:

operating the first drive transistor to sink current having a magnitude at least as great as the first magnitude from the base of the first switching transistor while supplying the first current to the base of the first switching transistor, thereby operating the first switching transistor to a nonconductive state to impede write current from the first tap; and operating the second drive transistor to sink current having a magnitude less than the second magnitude from the base of the second switching transistor while supplying the second current to the base of the second switching transistor, thereby operating the second switching transistor to a conductive state to conduct write current to the second tap.

14. A method of operating a switching transistor coupled between a voltage source and a terminal of a magnetic transducer, comprising:

supplying operating current to a control region of the switching transistor;

operating a drive transistor in a first conductive state to conduct a first current, having a first magnitude, between the control region of the switching transistor and the voltage source, while supplying operating current to the control region to operate the switching transistor to a conductive state; and operating the drive transistor in a second conductive state to conduct a second current, having a magnitude greater than the first magnitude, between the control region and the voltage source, while supplying operating current to the control region, the second current operating the switching transistor to a nonconductive state.

15. A write driver circuit for driving an inductive-type transducer, the write driver including a load terminal for coupling to the inductive-type transducer, first and second supply terminals for coupling to first and second voltage sources, the write driver further including:

a switching transistor coupled between the load terminal and the second supply terminal;

a current source, coupled between the first supply terminal and a control region of the switching transistor, for supplying current to the control region of the switching transistor to operate the switching transistor to a conductive state;

a drive transistor having a pair of terminating regions and a control region for varying conduction between the pair of terminating regions, the pair of terminating regions coupled between the current source and the second supply terminal;

a bias resistor, coupled between the control region of the drive transistor and one of the pair of terminating regions, for causing the drive transistor to constantly divert current of the current source from the control region of the switching transistor during operation of the write driver; and input means, coupled to the control region of the drive transistor, for increasing conduction between the pair of terminating regions to operate the switching transistor to a nonconductive state.

* * * * *

UNITED STATES PATENT AND TRADEMARK OFFICE
CERTIFICATE OF CORRECTION

PATENT NO. : 5,532,631
DATED : JULY 2, 1996
INVENTOR(S) : TUAN V. NGO, RAYMOND E. BARNETT

It is certified that error appears in the above-indentified patent and that said Letters Patent is hereby corrected as shown below:

Col. 5, line 21, delete "QS", insert --Q5

Signed and Sealed this

Eighth Day of October, 1996

Attest:

BRUCE LEHMAN

Attesting Officer                Commissioner of Patents and Trademarks